US012731962B2

(12) United States Patent
Margaritis

(10) Patent No.: US 12,731,962 B2
(45) Date of Patent: Sep. 8, 2026

(54) NARROW LINEWIDTH SEMICONDUCTOR LASER

(71) Applicant: Georgios Margaritis, Los Altos, CA (US)

(72) Inventor: Georgios Margaritis, Los Altos, CA (US)

(73) Assignee: IOPTIS CORP., Los Altos, CA (US)

(*) Notice: Subject to any disclaimer, the term of this patent is extended or adjusted under 35 U.S.C. 154(b) by 736 days.

(21) Appl. No.: 17/842,785

(22) Filed: Jun. 17, 2022

(65) Prior Publication Data

US 2023/0411929 A1 Dec. 21, 2023

(51) Int. Cl.

| | |
|---|---|
| ***H01S 5/12*** | (2021.01) |
| ***H01S 5/026*** | (2006.01) |
| ***H01S 5/028*** | (2006.01) |
| ***H01S 5/062*** | (2006.01) |

(52) U.S. Cl.

CPC ............ *H01S 5/1206* (2013.01); *H01S 5/026* (2013.01); *H01S 5/028* (2013.01); *H01S 5/062* (2013.01); *H01S 5/1234* (2013.01)

(58) Field of Classification Search

CPC ..... H01S 5/14–148; H01S 5/06; H01S 5/1014

See application file for complete search history.

(56) References Cited

U.S. PATENT DOCUMENTS

| | | | | |
|---|---|---|---|---|
| 5,347,526 | A * | 9/1994 | Suzuki | H01S 5/06258 372/50.1 |
| 2002/0067540 | A1 * | 6/2002 | Delprat | H01S 5/50 359/344 |
| 2010/0303121 | A1 * | 12/2010 | Alalusi | H01S 5/141 372/92 |
| 2016/0380407 | A1 * | 12/2016 | Sysak | H01S 5/1228 398/214 |
| 2019/0372307 | A1 * | 12/2019 | Morton | H01S 5/1212 |
| 2021/0098969 | A1 * | 4/2021 | Matsui | H01S 5/1209 |

OTHER PUBLICATIONS

Sherwin Group Conversion (Year: 2025).*

* cited by examiner

*Primary Examiner* — Tod T Van Roy
*Assistant Examiner* — Hunter Jared Nelson

(57) ABSTRACT

A novel narrow linewidth laser device is disclosed that is formed monolithically on a semiconductor substrate, such as an indium phosphide substrate, that includes a continuous waveguide with a gain section and a grating section wherein a grating is constructed so that its power reflectivity profile has a ratio of reflectivity slope over reflectivity at the 3 dB point below the reflectivity peak on the red side (longer wavelength side) of the grating larger than a value of 2/nm. The operating wavelength of the device may be tuned thermally, electrically, or thermo-electrically to be on the red side of the fiber Bragg grating reflectivity profile, preferably at the 3 dB point below the reflectivity peak or lower. In another embodiment, a second grating is formed on a second grating section of the waveguide on the opposite side of the gain section than the first grating section and wherein the reflectivity profile of the second grating overlaps at least a portion of the reflectivity profile of the first grating.

20 Claims, 5 Drawing Sheets

NARROW LINEWIDTH SEMICONDUCTOR LASER

This application claims the benefit of U.S. Provisional Application No. 63/213,963, filed on Jun. 23, 2021.

FIELD OF THE INVENTION

The present invention relates to narrow linewidth semiconductor laser devices.

BACKGROUND

Narrow linewidth is a very desirable property of laser devices used in many different applications, such as coherent telecommunications, interferometric sensing, Lidars etc. Narrow linewidth is essential to achieving lower dispersion and higher signal to noise ratios in these application.

There are many prior art ways of achieving narrow linewidth. For example, Fiber Lasers use a hybrid architecture that achieves narrow linewidth by having a very long laser cavity. However a very long cavity suffers from thermal and acoustic noise, and has a large form factor. More compact Fiber Bragg Grating (FBG) based lasers and Planar Lightwave circuit (PLCs) based lasers achieve narrow linewidth by using a hybrid architecture where a semiconductor laser chip is combined with an external grating integrated into either a fiber or a silica or other insulating planar waveguide to form an external cavity laser. However, these devices still have large form factors, are difficult to assemble and cannot easily be combined with other integrated photonics platforms.

It is therefore desirable to develop a very compact narrow linewidth semiconductor device that achieves the same or better performance than larger form factor devices while having excellent environmental stability, and maintaining a very small form factor and compatibility with other integrated photonic platforms.

SUMMARY OF THE INVENTION

The present invention relates to compact narrow linewidth semiconductor devices. The device disclosed in the present invention achieves ultra-narrow linewidth, has excellent environmental stability, very small form factor and compatibility with other integrated photonic platforms.

According to one embodiment of the present invention, the device includes an active gain section and a waveguide section joined monolithically together to minimize refractive index mismatch between the sections, with anti-reflection coating (ARC) on an end facet of the waveguide section and high-reflectivity coating (HRC) on an end facet of the gain section, and a grating formed on, above or below to the waveguide section. The gain section is designed and manufactured to have low leakage, and low electrical noise while the grating is designed and manufactured to have high reflectivity, narrow bandwidth, high red side slope, and high red side lobe suppression ratios. The waveguide section or/and the grating may have a variable width along its length to apodize the grating profile. The operating wavelength of the device is tuned thermally, electrically, or thermo-electrically to be on the red side of the grating reflectivity profile, preferably close to or below the −3 dB point. The device of this invention can be positioned on top of one or more thermoelectric coolers (TECs) to control the temperature of the device.

In other embodiments of the present invention, a heater is disposed on a portion of the device surface to provide additional flexibility in adjusting the operating wavelength of the device.

In other embodiments of the present invention, a phase section is added to the gain and waveguide sections to provide further flexibility in adjusting the operating characteristics of the device.

In other embodiments of the present invention, the active section and waveguide section may have an intermediate waveguide section, which may be tapered to join them.

In other embodiments of the present invention, a second grating is formed to replace the high-reflectivity coating (HRC) opposite to the waveguide section with respect to the gain section.

In general, according to the teachings of the present invention, many combinations of one or more gain, grating, phase, tapered and heater sections can be assembled to provide the desired performance.

LIST OF FIGURES

FIG. 1*a* shows a top view of one exemplary embodiment of the narrow linewidth semiconductor device of the present invention with a variable width waveguide section.

FIG. 1B shows a top view of a second exemplary embodiment of the narrow linewidth semiconductor device of the present invention with a constant width waveguide section.

FIG. 2*a* shows a cross sectional view of the first exemplary embodiment of the narrow linewidth semiconductor device of the present invention, where a grating is formed into the top surface of the waveguide section.

FIG. 2*b* shows a cross sectional view of another exemplary embodiment of the narrow linewidth semiconductor device of the present invention, where a grating is formed in a separate layer below the waveguide section.

DESCRIPTION OF THE INVENTION

It is noted that in the following description and the accompanying illustrations, for better clarity, elements that are known in the Art are ignored, if they are not necessary for the understanding of the invention, or are only referred by name without a detailed description. Also, numbering of some obvious repetitive elements in the Figures is omitted.

Figure 1A:
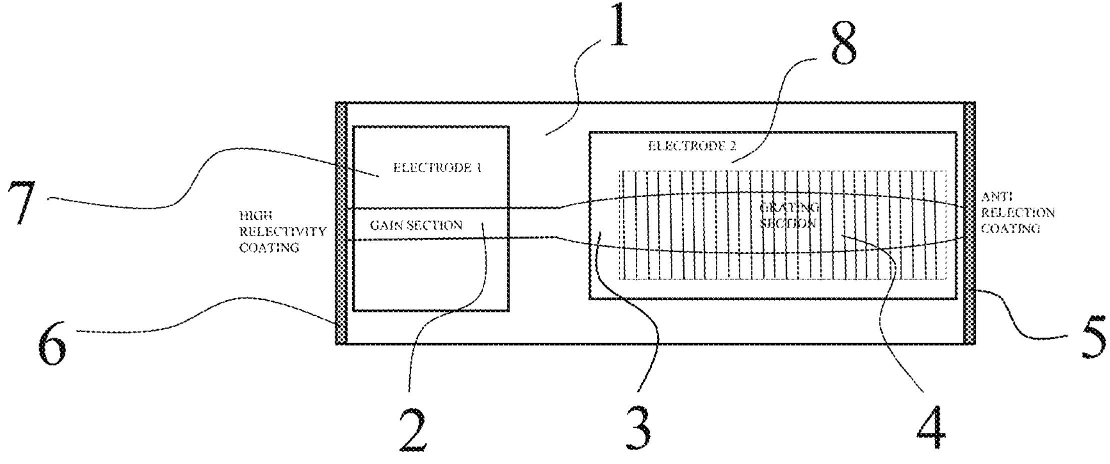
Figure 2A:
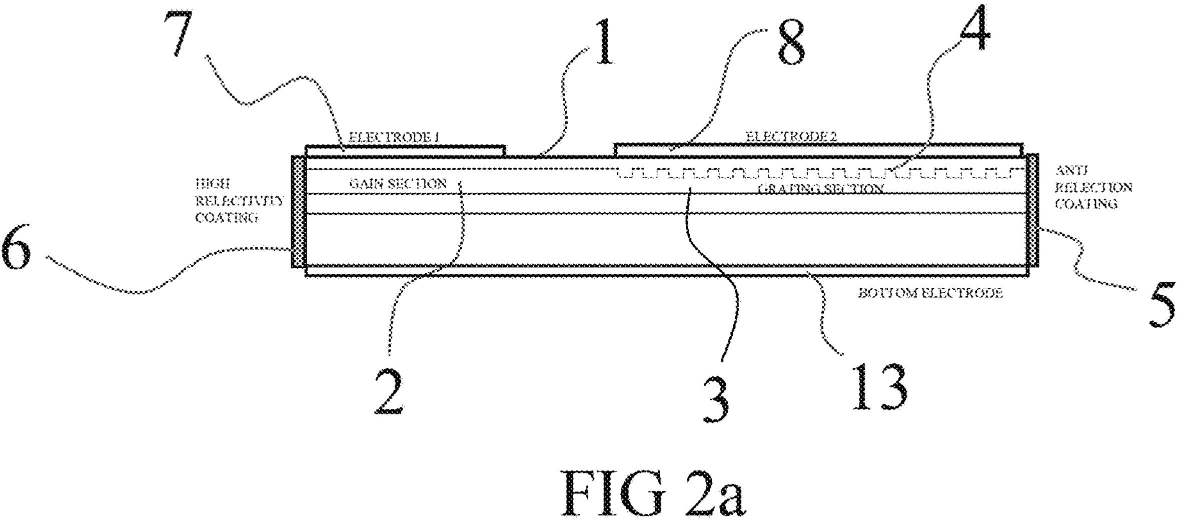
Figure 2B:
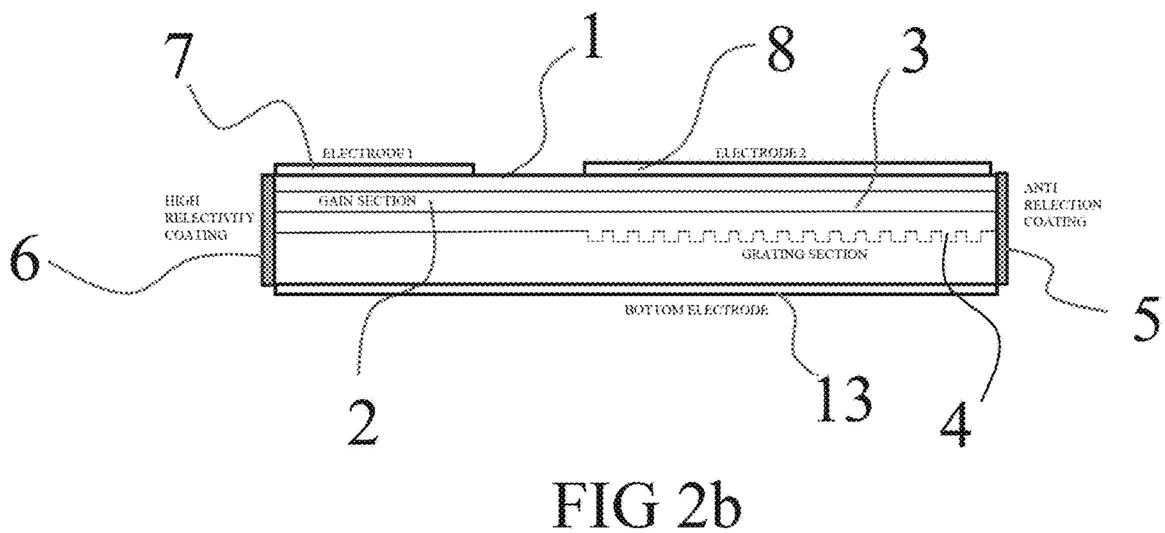

FIG. 1*a* and FIG. 2*a* show a top view and a cross sectional view, respectively, of a first embodiment of the device of the present invention. A gain section 2 is an active waveguide (InGaAsP) formed on top of an Indium Phosphide (InP) semiconductor substrate 1. Many types of different manufacturing techniques and structures for active waveguides are known in the Art, such as ridge waveguides (RW) or buried heterostructures (BH). The gain section 2, preferably has one to four quantum wells (QW) to achieve low differential gain, although more are also possible. The width of the gain section 1 is typically 1 to 2 μm, and the length of the gain section is typically 300 to 1000 um. Other width and lengths of the gain section are also possible. The blocking layers around the gain section should typically have very low leakage by careful control of the manufacturing process. A wet etch, dry etch or mixed dry/wet etch can be used to create the mesa in BH structures or the ridge in RW structures. Further, the blocking layers in BH structures can be of the semi-insulating or p-n types or other blocking types known in the Art. The electrical noise of the gain section should also preferably be low by careful control of the ohmic resistance along the electrical path, and by careful control of the manufacturing process to achieve low defect density. A waveguide section 3 is also formed on top of the Indium Phosphide (InP) substrate 1. The waveguide 3 is optically connected to the gain section 2. The waveguide 3 (e.g. InP based) can have a variable width, as shown in FIG. 1*a*. A grating (e.g. Bragg grating) 4 is formed either on the top surface of the waveguide 3, as shown in FIG. 2*a*, or on a layer above or below the waveguide 3, as shown in FIG. 2*b*. The variable width of waveguide 3 has the advantage of apodizing the grating 4 to achieve the desired grating characteristics for the operation of the device, as described further below. The kappa of the grating (also called gain coupling coefficient or grating strength) is typically 1/cm to 10/cm, but it can have other values as well, with proper grating length selection. The length of the grating is typically 1 mm to 20 mm, but other lengths are possible with the proper selection of kappa. One of many possible empirical relations between kappa (in 1/cm) and grating length (in mm) could be (kappa)*(grating length)=10 to 25. Typically, one end of the device of this invention is Anti Reflection (AR) coated 6 and the other end 5 is High Reflection (HR) coated. Electrode 7 is used to bias the active section 2 and optional electrode 8 can be used to adjust the phase of grating section 4. A bottom electrode 13 is also formed on a bottom surface of semiconductor substrate 1.

Figure 5:
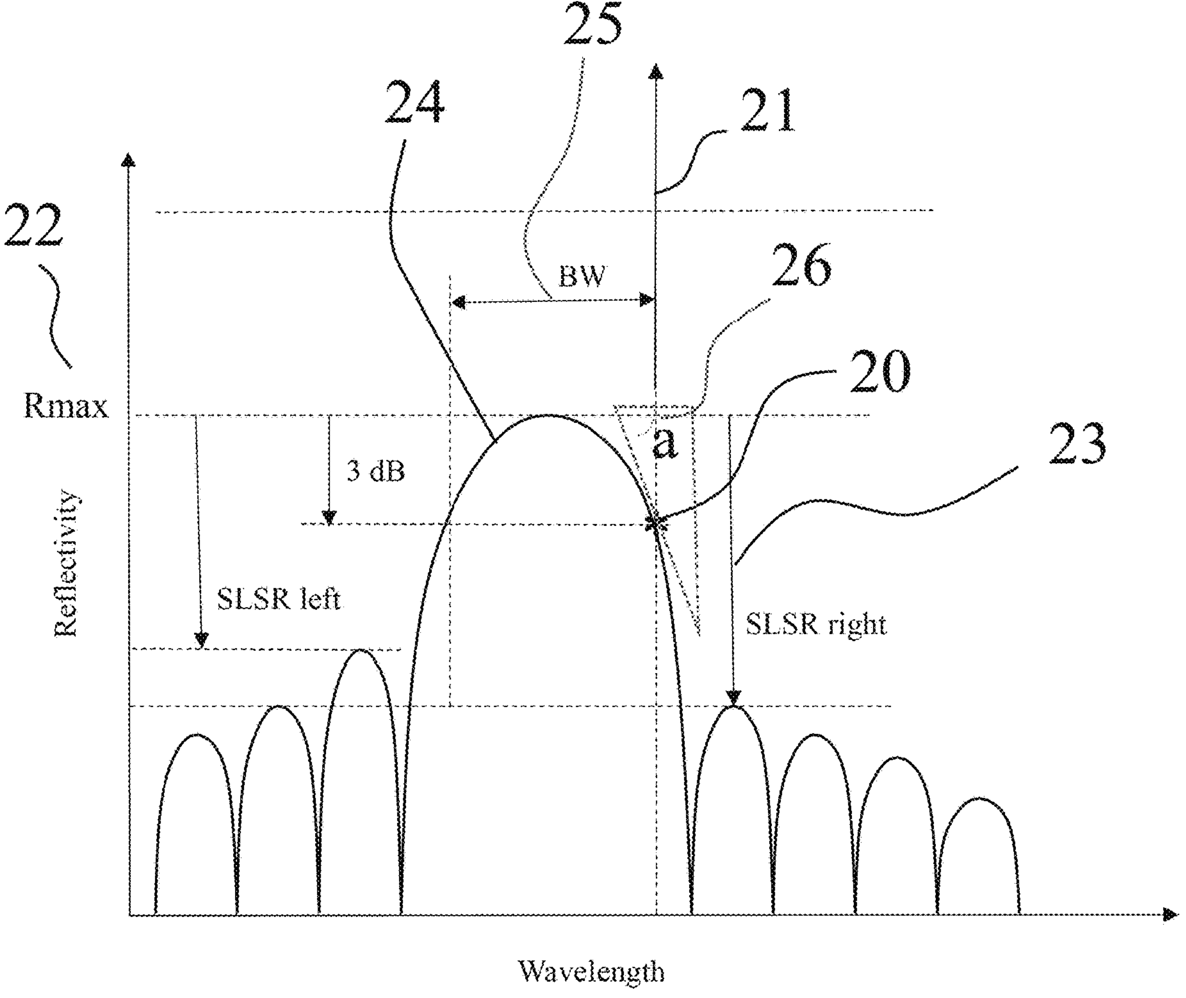
FIG. 5 shows an exemplary power reflectivity profile of the waveguide section grating of the present invention.

FIG. 5 shows a generic power reflectivity profile 24 of the grating 4 of FIG. 1*a* of this invention. The grating is constructed such that the absolute value of the tangent of angle a, 26 in FIG. 5, at the 3 dB point, 20 in FIG. 5, below the reflectivity peak on the red side of the grating (i.e. the absolute value of the slope at the −3 dB red point), and its maximum reflectivity, henceforth called Rmax, 22 in FIG. 5, have a ratio, henceforth called S/R ratio, greater than 2/nm, i.e. abs(tan(a))/Rmax>2/nm. In general the higher the S/R ratio the lower the linewidth. An S/R ratio of greater than 2/nm can produce Lorentzian linewidths less than 50 kHz, an S/R ratio greater than 15/nm can produce Lorentzian linewidths less than 15 kHz and an S/R ratio greater than 30/nm can produce Lorentzian linewidth less than 5 kHz, and an S/R ratio greater than 60/nm can produce Lorentzian linewidth less than 2 kHz etc. However, other smaller S/R ratios are acceptable in applications with less demanding linewidth, such as pulsed Lidar applications. The grating profile 24 also typically has a side lobe suppression ratio (henceforth called SLSRr) on the red side of the grating, 23 in FIG. 5 greater than 5 dB. The SLSRr, should preferably be greater than 10 dB. The grating can be uniform or apodized by adjusting the width of the waveguide section 3 of FIG. 1*a* as needed, to meet the SLSRr requirements. In FIG. 5, 25 is the −3 dB bandwidth (henceforth called BW) of the grating.

Figure 1B:
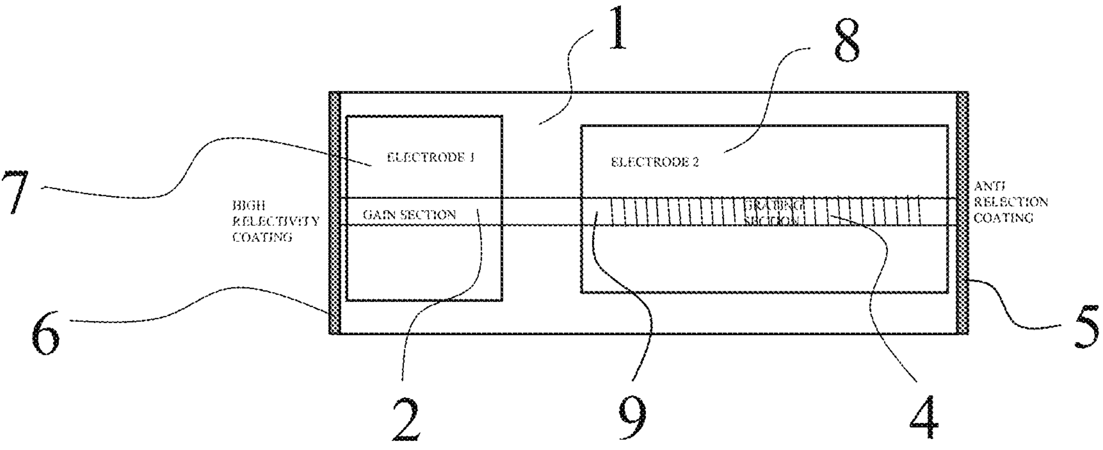

A uniform waveguide 9, as shown in FIG. 1*b*, is also capable of producing a power reflectivity profile that meets the desired S/R ratios and SMSRrs, as taught here. Typically the refractive index contrast of the grating, its physical length and waveguide width should be varied, preferably first in a design tool, such as FIMMWAVE from Photon Design or GratingMOD from Synopsys, to find appropriate values, before it is manufactured. It is noted that many gratings with physical lengths greater than about 0.3 mm, in InP or other semiconductor gain media, could be manufactured to achieve high S/R ratios and high SLSRrs. Although gratings with long physical lengths could be used, restricting gratings to lower lengths, e.g. <10 mm, but adjusting kappa and apodization to achieve desired S/R ratios and SMSRrs, as taught in this invention, can achieve very narrow linewidth, and reduced acoustic and thermal noise and form factor.

The device of this invention can be positioned on top of one or more thermoelectric coolers (TECs) (not shown since they are well known in the Art) to control the temperature of the device. The operating wavelength of the device, 21 in FIG. 5, may be tuned thermally, electrically, or thermo-electrically to be on the red side of the grating reflectivity profile, preferably at the 3 dB point below the reflectivity peak, 20 in FIG. 5, or lower. In general, changing the temperature of the gain chip or/and grating to the same or different values, or changing the bias current or currents through the gain element or/and grating or/and phase section (if one is added to the device), will change the lasing wavelength of the device along the grating profile 24 in FIG. 5. The optimal operating point is at the 3 dB point, 20 in FIG. 5, below the reflectivity peak, or lower.

Numerous other embodiments of the device of this invention are possible. The gain medium could be alloys based on indium phosphide (InP), Gallium Arsenide (GaAs), Gallium Nitride or any other active optical semiconductor material known in the art of any optical design wavelength, for example 980 nm, 1064 nm, 1320 nm or 1550 nm, 1650 nm etc. The front end 5 could be AR coated, angled or both. The second end 6 could be as cleaved or even coated with a low reflectivity coating, instead of HR coated. The second end 6 could also be AR coated, and an external mirror or lenses and mirrors could be appropriately positioned outside the device to reflect all or portion of the light exiting end 6 back into gain section 2. The gain section 2 could also include a phase section, a grating and/or a beam expander. The output of the device could be collected from a fiber (that could be lensed and/or coated with a low reflectivity coating). The fiber could be single mode (SM) or Polarization maintaining (PM) fiber or any other optical fiber known in the Art. With a high numerical aperture fiber, a flat fiber end face, instead of the lens can achieve good coupling efficiency. Lenses and isolators beyond end 5 can be used to carry the light out of the device and provide protection from back reflections, as is well known in the Art. The device of this invention can also be integrated in a photonic circuit. Further, numerous enclosing packages can be used to house the device of the present invention, such as butterfly packages, TOSAs, hermetic or non-hermetic metal, plastic or ceramic enclosures etc.

Figure 3:
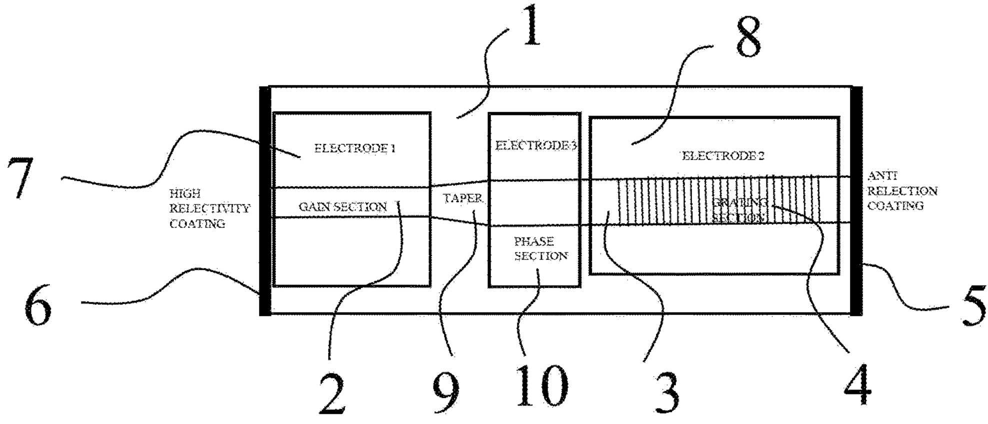
FIG. 3 shows a top view of another exemplary embodiment of the narrow linewidth semiconductor device of the present invention, where a tapered and a phase section is formed between the gain section and the waveguide section.

FIG. 3 shows another embodiment of the present invention where a tapered section 9 is formed between active section 2 and waveguide section 3 to better match optical modes in the two sections. Optionally, a phase section 10 can also be formed in the device to adjust the phase and/or operating point of the device or to introduce frequency modulation.

Figure 4:
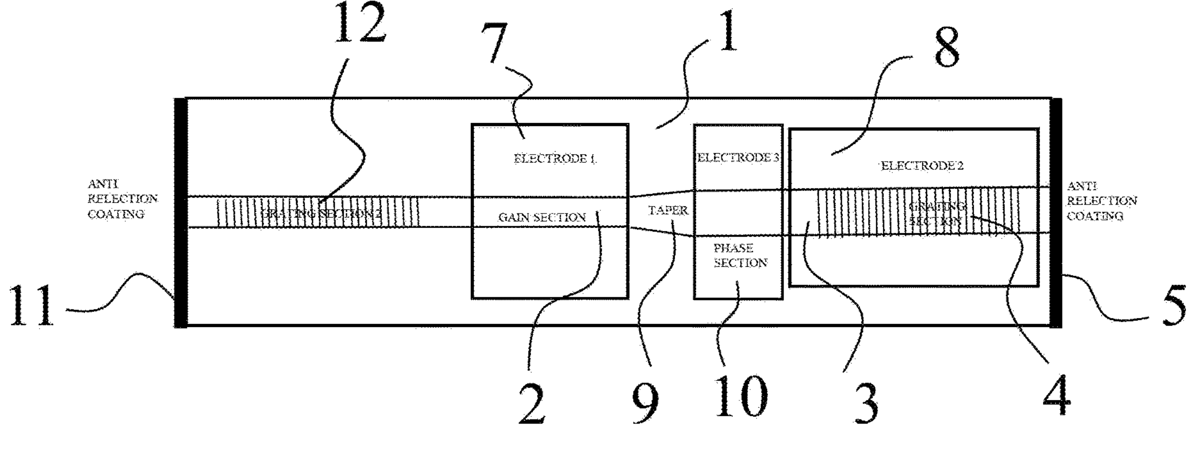
FIG. 4 shows a top view of another exemplary embodiment of the narrow linewidth semiconductor device of the present invention, where a second grating behind the gain section provides selective back reflection.
Figure 6:
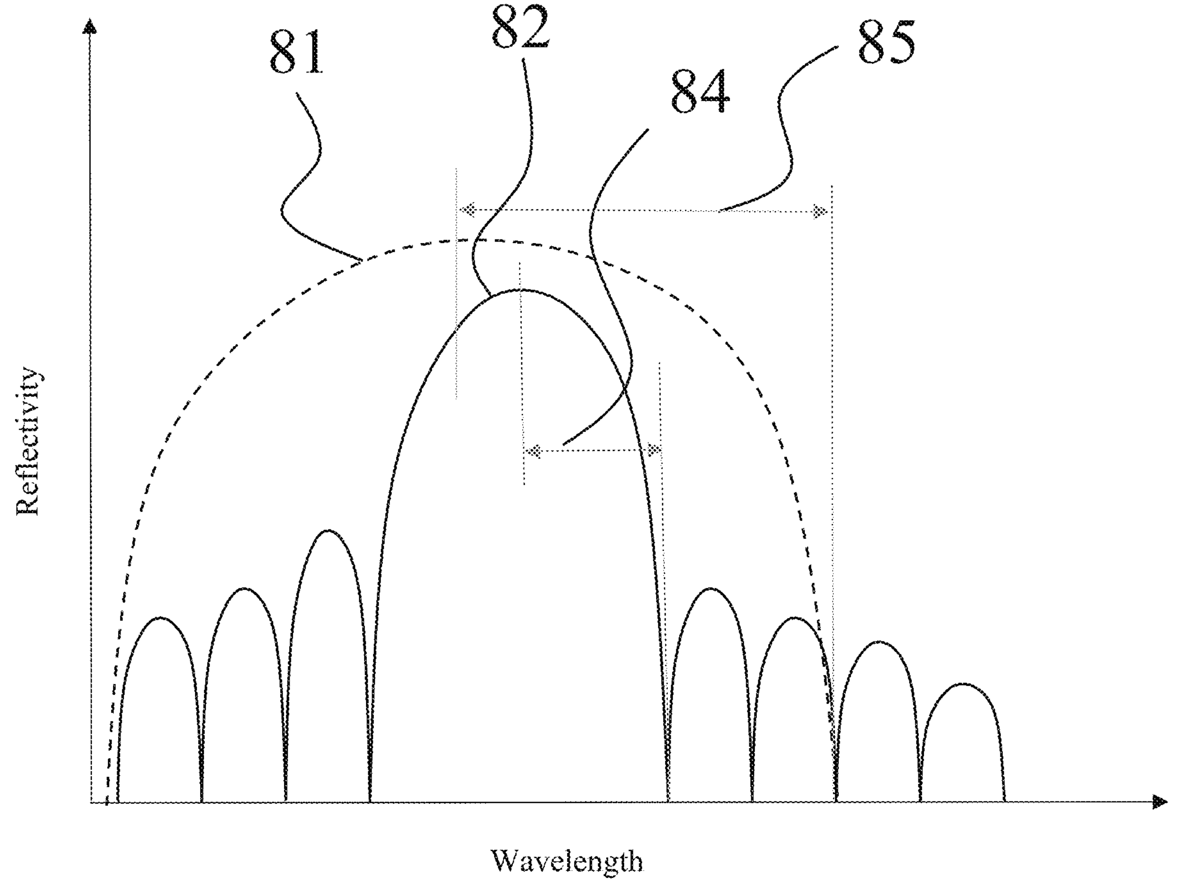
FIG. 6 shows an exemplary power reflectivity profile of a second grating overlapping a portion of the power reflectivity profile of the waveguide section grating of the present invention.

FIG. 4 shows another embodiment of the present invention including a second grating 12. The grating 12 has a power reflectivity profile with main lobe shown as 81 of FIG. 6. The red portion 85 of the main lobe 81 overlaps with the red portion 84 of the main lobe 82 of grating 4 of FIG. 6. In general, main lobes 81 and 82 should each one have at least a portion that overlaps with a portion of the other.

All embodiments above should be construed broadly, since numerous variations of the embodiments can be made by a person skilled in the Art, by substituting any element or elements of a shown embodiment with another element or elements of another embodiment or with an element or elements known in the Art that perform or accomplish the same or similar function.

What is claimed is:

1. A semiconductor laser device comprising a continuous waveguide formed on a semiconductor substrate, wherein said waveguide includes a gain section configured to produce light in response to a bias current and a grating section that includes a grating, wherein a ratio of an absolute value of a power reflectivity slope at a minus three dB point on a red side of said grating to a maximum value of a power reflectivity of said grating is greater than 2/nm, whereby the device is configured to produce single mode laser light with a Lorentzian linewidth smaller than 50 KHz.

2. The semiconductor laser device of claim 1, wherein said waveguide in said grating section has a variable width to apodize a grating profile.

3. The semiconductor laser device of claim 1, wherein said waveguide has an Anti-Reflection coating at a first end.

4. The semiconductor laser device of claim 1, wherein said waveguide has a High-Reflectivity coating at a second end.

5. The semiconductor laser device of claim 1, wherein said grating has a length between 1 mm and 20 mm.

6. The semiconductor laser device of claim 1, further comprising electrodes on the grating section to adjust a phase of said grating section.

7. The semiconductor laser device of claim 1, wherein said grating is formed in a layer above or inside said waveguide.

8. The semiconductor laser device of claim 1, wherein a kappa value of said grating is preselected to be in a range of 1/cm to 10/cm.

9. The semiconductor laser device of claim 1, wherein a kappa value of said grating multiplied by its length has a value in a range of 10 to 25.

10. The semiconductor laser device of claim 1, wherein a side lobe suppression ratio on the red side of said grating is greater than 5 dB.

11. The semiconductor laser device of claim 1, wherein said waveguide of the gain section is preselected from a ridge-waveguide (RW) or buried-heterostructure (BH) structure.

12. The semiconductor laser device of claim 1, wherein said gain section is preselected to have between one and four quantum wells.

13. The semiconductor laser device of claim 1, wherein said gain section achieves a differential gain on the order of $10^{-16}$ $cm^2$.

14. The semiconductor laser device of claim 1, wherein said gain section has a length between 300 μm and 1000 μm.

15. The semiconductor laser device of claim 1, wherein said gain section is preselected to include either semi-insulating or p-n-type blocking layers.

16. The semiconductor laser device of claim 1, wherein said gain section is manufactured from an active optical semiconductor material and configured to operate at a wavelength supported by said material.

17. The semiconductor laser device of claim 16, wherein said gain section is manufactured from a material selected from a group consisting of indium phosphide (InP)-based alloys, gallium arsenide (GaAs)-based alloys, or gallium nitride (GaN)-based alloys, and is configured to operate within a wavelength range supported by the selected material.

18. The semiconductor laser device of claim 17, wherein said wavelength range includes 980 nm, 1064 nm, 1320 nm, 1550 nm, or 1650 nm.

19. The semiconductor laser device of claim 1, wherein said slope, said maximum reflectivity, and said ratio are preselected so that the device can produce single-mode laser light with a Lorentzian linewidth smaller than a value selected from a group consisting of 50 KHz, 15 KHz, 5 kHz, and 2 KHz.

20. The semiconductor laser device of claim 1, wherein said ratio is greater than a value selected from a group consisting of 15/nm, 30/nm, and 60/nm.

* * * * *